United States Patent [19]
Ericksen

[11] 3,961,911
[45] June 8, 1976

[54] TUBE CUTTING AND INSERTING MACHINE

[75] Inventor: Orland W. Ericksen, Park Ridge, Ill.

[73] Assignee: Motorola, Inc., Chicago, Ill.

[22] Filed: Jan. 30, 1975

[21] Appl. No.: 545,270

[52] U.S. Cl. ................... 29/203 B; 29/243.53; 29/625; 227/60; 227/97
[51] Int. Cl.² ............................................. H01R 43/04
[58] Field of Search ............... 29/203 B, 625, 628, 29/417, 243.52, 243.53, 243.54; 227/97, 55, 60–62

[56] References Cited
UNITED STATES PATENTS

| | | | |
|---|---|---|---|
| 2,871,479 | 2/1959 | Wright et al. | 227/97 |
| 2,979,721 | 4/1961 | Helda | 227/97 |
| 3,485,432 | 12/1969 | Lagasse et al. | 227/97 |
| 3,495,754 | 2/1970 | Henshaw | 227/60 |
| 3,670,385 | 6/1972 | Cropp | 29/203 B |
| 3,744,129 | 7/1973 | Dewey, Jr. | 29/628 |
| 3,812,569 | 5/1974 | Kufner | 29/203 B |

Primary Examiner—Carl E. Hall
Attorney, Agent, or Firm—James W. Gillman; Victor Myer

[57] ABSTRACT

A pneumatic machine for cutting flexible tubing and inserting the cut pieces onto a printed circuit board is disclosed. The machine unwinds a spool of tubular material, cuts a predetermined length off the end thereof and inserts the cut length onto a printed circuit board. The sequencing and timing relationship between the feeding, cutting, and inserting steps is controlled by a cyclic sequencing apparatus which is activated by a foot switch.

A machine for forming and inserting eyelets into a printed circuit board is also described. The eyeleting machine unwinds a spool of tubular solderable material, cuts off a length of the tubular material, and inserts the cut tubing into a printed circuit board hole and then forms a shoulder on both ends of the inserted tubing. The sequencing and timing between the feeding, cutting, and inserting operations is controlled by a sequencing apparatus which is activated by a foot switch.

10 Claims, 3 Drawing Figures

TUBE CUTTING AND INSERTING MACHINE

BACKGROUND OF THE INVENTION

In the electronic industry, many times, it is necessary to prevent solder from flowing into printed circuit board holes and onto male and female connectors mounted on printed circuit boards. Most printed board assemblies are wave soldered, which consists of exposing the entire underside of a printed circuit board to a molten wave of solder. Prior techniques of restricting solder flow have been to use toothpicks inserted into printed circuit board holes and non-solderable caps hand inserted over connector terminals. The hand inserting operations are costly and the additional handling of the printed circuit board can adversely affect its subsequent solderability.

One method of forming a conductive through connection in a printed circuit board is to use a metal "eyelet", a preformed metallic component, that is inserted into a printed circuit board. Eyelets are also used to insure good solderability of components to printed circuit boards. Individual eyelets are formed separately or in strip form on a roll. The formed eyelets are then loaded into a standard eyeleting machine which inserts them into a printed circuit board. Thus the material cost of the individual preformed eyelets and the cost of inserting the eyelets into a printed circuit board are both incurred during printed circuit board assembly.

SUMMARY OF THE INVENTION

An object of the present invention is to provide an improved machine for reducing printed circuit board assembly costs.

A further object of the invention is to provide an improved machine for inserting solder masking tubing onto components and into holes.

Still another object of the invention is to provide an improved machine for eyeleting a printed circuit board.

In one embodiment of the present invention a machine is provided for inserting tubing onto a contact member which includes: a base; support means associated with said base for holding a supply of continuous tubular material having an end portion; means coupled to said base for feeding said end portion a predetermined amount; means coupled to said base for cutting a predetermined length of said tubular material from said end portion and locating said cut tubing length in a predetermined position; means coupled to said base for inserting said cut tubing length from said predetermined position onto a contact member; means coupled to said base for sequentially activating said feeding, cutting, and inserting means according to a predetermined timing relationship; and means coupled to the sequencing means for actuating thereof.

The basic operation of the machine consists of unwinding tubular material from a spool thereof by feeding the end of the material into a cutting location. A portion of the end of the material is then cut off by a shearing motion and positioned underneath an inserting rod. The inserting rod is then activated and pushes the cut tubular material onto a contact member comprising either a printed circuit board component or a printed circuit board hole. The feeding, cutting, and inserting steps are coordinated by a sequencing apparatus which cyclicly activates and de-activates the machine operations according to predetermined timing relationships. In a particular embodiment, the sequencing means, actuated by a foot switch, steps the feeding, cutting and inserting apparatus through one complete cycle.

When flexible teflon tubing is used as the tubular material, the machine performs a solder masking function for critical components and holes on printed circuit boards which must be maintained free of solder. When copper tubing, a push rod having reduced end portion, and an opposing finger projection attached to the base are used, the machine performs the combined functions of forming an individual eyelet from the copper tubing and inserting it into a printed circuit board hole.

Thus a solder masking machine has been provided which eliminates a costly hand inserting operation, and a eyeleting machine has been provided which eliminates the material costs of purchasing preformed individual eyelets and subsequently inserting them into printed circuit boards.

BRIEF DESCRIPTION OF THE DRAWINGS

For a more complete understanding of the invention reference should be made to the drawings in which:

Referring to FIG. 1, a tube cutting and inserting machine 10 is shown having a rectangular horizontal metal base plate 11 which forms the supporting base of the machine. Vertical support members 12 and 13 each have one end attached to base plate 11 and another end supporting the ends of a roller 14. A spool 15 of a tubular material 16 is axially positioned on roller 14. A horizontal cross bar member 17 is attached below roller 14 and between vertical support members 12 and 13 and has a standard stock straightening assembly 18 extending upward from the center of the cross bar. The straightening assembly consists of a series of five pulley shaped wheels 18a which are arranged such that as the material 16 is unwound from spool 15, the tubular material passes along the inner groves of pulley wheels 18a which straighten out the tubular material.

Figure 1:
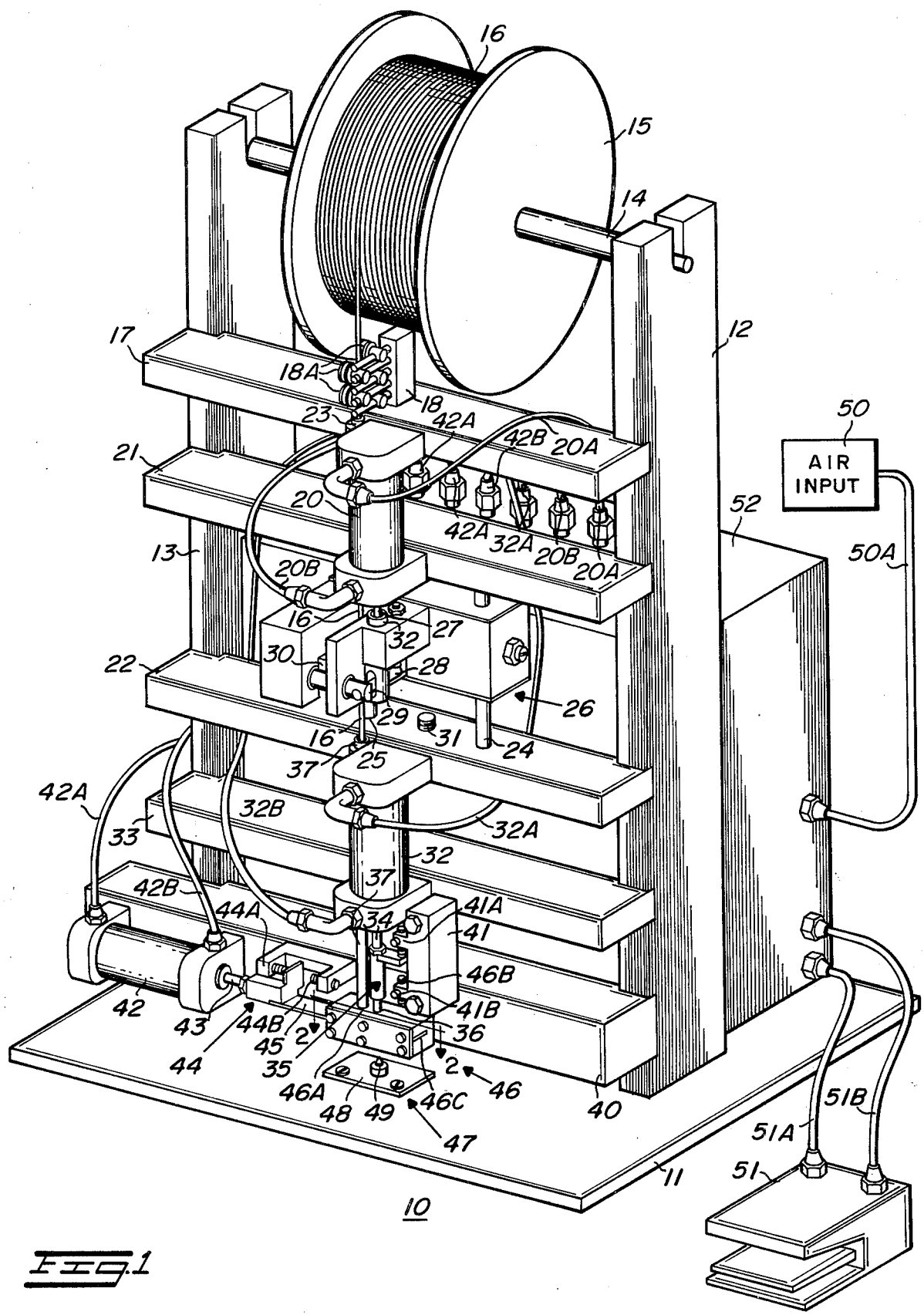
FIG. 1 is a perspective view of the inventive tube cutting and inserting machine.

A vertically positioned air cylinder 20 has one end attached to the center of cross bar 17 and its other end attached to the center of a cross bar 21 which is located parallel to and below cross bar 17 and is also attached to vertical support members 12 and 13. Air cylinder 20 has an air tube 20A attached to its top end and an air tube 20B attached to its bottom end. Another horizontal cross bar 22 is also connected between vertical support members 12 and 13 and is located parallel to and below cross bar 21. A vertical tube guide 23 for material 16 is attached alongside air cylinder 20. A pair of vertical guide bars 24 and 25 are mounted between cross bars 21 and 22.

A feeding apparatus generally referred to as 26 has two vertical holes in it through which bars 24 and 25 pass. Air cylinder 20 has a vertical downwardly facing piston rod 27 which is coupled to feeding assembly 26 and causes assembly 26 to move vertically along bars 24 and 25 when the air cylinder is actuated. The piston rod 27 has an elongated oval central cavity in its bottom portion through which passes a mechanical linkage 28 which is attached at one end to a cam shaped cylinder 29. A pressure plate 30 is in contact with cam shaped cylinder 29 and is spring biased to maintain an opening in feeding mechanism 26 through which the tubular material 16 can pass freely when the cam shaped cylinder is not substantially rotated. A bottom stop projection 31, which is upwardly extending from cross bar 22, limits the downwards motion of assembly 26. A metal sleeve 32, disposed around push rod 27 at the upward part of assembly 26, limits the upward motion of assembly 26 along guide rods 24 and 25. The assembly 26 has Bakelite braking rings (not shown) in the two verticle holes which surround guide rods 24 and 25 and these rings provide for slightly inhibiting the sliding motion of assembly 26 on the guide rods as will be explained later.

A vertical air cylinder 32 has its top end attached to the cross bar 22 and its bottom end attached to a cross bar 33 which is parallel to and below cross bar 22 and attached to vertical support members 12 and 13. A piston 34 of cylinder 32 extends vertically downwardly and is connected to an inserting mechanism generally referred to as 35 which contains a vertical push rod member 36 having a downwardly pointing reduced diameter tapered end section 36A (shown in FIG. 2). Cylinder 32 is shown having an upper air tube 32A and a lower air tube 32B. A vertical tube guide 37 for material 16 is connected between cross bar members 22 and 33 and extends below cross bar member 33. A lower horizontal support member 40 is connected between vertical support members 12 and 13 and below and parallel to horizontal support member 33. A stop travel member 41, having horizontal projections 41A and 41B, is connected between support members 33 and 40 and limits the up and down travel of inserting mechanism 35.

A horizontal air cylinder 42 is mounted on cross bar support 40 and has a horizontal piston arm 43 attached to a slide mechanism, generally referred to as 44, which has a horizontally extending rectangular cutting plate 45. An air tube 42A is connected to one end of air cylinder 42 and an air tube 42B is connected to the other end. A pair of metal adjustable stoppers 44A and 44B extend outward from cross bar support 40 and limit the horizontal movement of cutting assembly 44.

A cutting box assembly generally referred to as 46 is mounted to horizontal support member 40 and has; a verticle top side opening 46A which receives the tubular material 16 coming from tube guide 37, a verticle through hole connection 46B through which inserting push rod 36 travels when inserting air cylinder 32 is actuated, and a horizontal slot through opening 46C through which horizontal cutting block 45 travels when air cylinder 42 is actuated.

An eyeleting assembly generally referred to as 47 is mounted on base 11 and consists of a flat plate 48 screwed down to base 11 and an upward facing finger projection 49 attached to plate 48 and having a reduced end portion 49A positioned in line with vertical through hole 46B. Base 11 has a metal nipple 47A (shown dotted in FIG. 2) which aids in locating assembly 47 on base plate 11 and also aids in locating a printed circuit board template when assembly 47 is not present and machine 10 is used for inserting teflon tubing into printed circuit board holes or onto connectors.

A compressed air supply 50, having an air tube 50A, and a foot switch 51, having air tubes 51A and 51B, are shown having their respective air tubes connected to a sequencing apparatus 52 which is mounted on verticle support members 12 and 13. Also shown connected to sequencing apparatus 52 are tubes 20A, 20B, 32A, 32B, 42A and 42B. The details of sequencing apparatus 52 are shown and explained subsequently.

Figure 2:
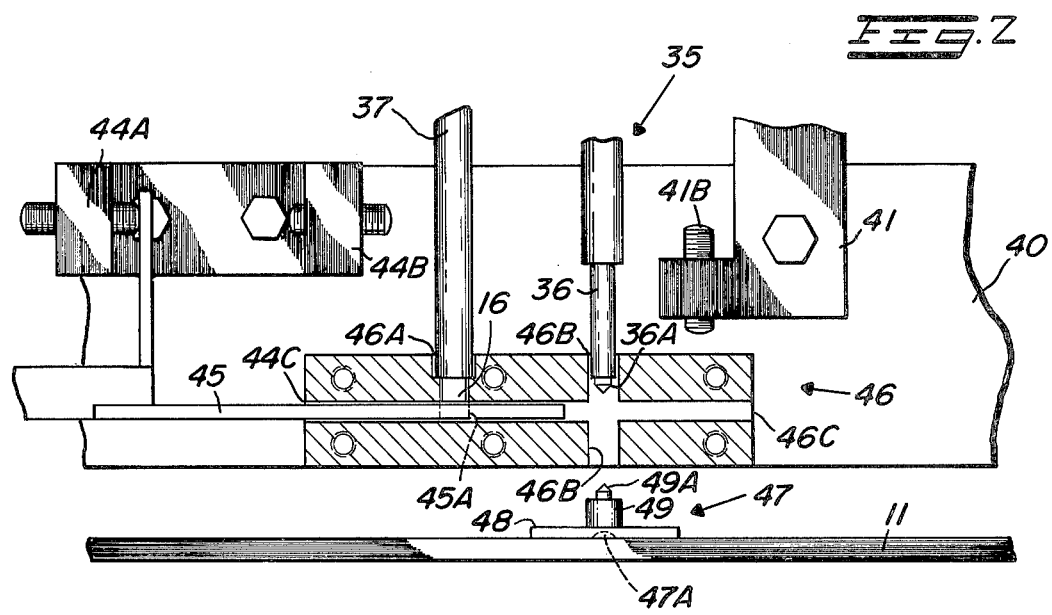
FIG. 2 is a cross sectional view of a portion of the inventive machine taken along lines 2—2 in FIG. 1.

Referring to FIG. 2, a cross sectional view of cutting box assembly 46, taken along lines 2-2 in FIG. 1, is shown. The cross sectional view of assembly 46 shows that horizontal slot opening 46C extends throughout the length of assembly 46, vertical passage 46A extends from the top of assembly 46 to the bottom of horizontal slot 46C, and vertical passage 46B extends vertically through all of assembly 46. Rectangular cutting plate 45 is shown in a first position and is a solid rectangular member having a single through hole 45A positioned in line with vertical passage 46A. Assembly 47 is shown attached to base 11 and positioned such that the end portion 49A of finger projection 49 is directly in line with and below through passage 46B.

The complete operation of the machine 10 can now be described in detail. Initially, tubular material 16 from spool 15 extends through stock straightener 18, tube guide 23, feeding mechanism 26, tube guide 37 and opening 46A, but does not extend into opening 45A. When foot switch 51 is depressed, sequencing apparatus 52 is energized and causes the sequential energizing and subsequent sequential deenergizing of air cylinders 20, 32, and 42. Air, through tube 20A, energizes air cylinder 20 and causes piston arm 27 to move in a downwardly direction. Piston 27 pushes against pivot rod 28 and rotates cam cylinder 29 causing front plate 30 to grasp tubular material 16. As piston 27 continues in a downwardly direction, assembly 26 is forced to travel downward along guide rods 24 and 25 until the bottom stop 31 is encountered by assembly 26. The Bakelite breaking rings of assembly 26 insure that the rotation of cam cylinder 29 takes place before the assembly 26 is moved in the downwardly direction. The effect of energizing cylinder 20 is, therefore, to advance a predetermined amount of tubular material 16 through tube guide 37.

The material 16 passes through opening 45A and the end portion rests in a first position against the bottom edge of channel 46C. Subsequently air is supplied through tube 42A and air cylinder 42 is energized which causes piston arm 43 to move in a horizontal direction thus causing cutting plate 45 to move in a horizontal direction. The motion of plate 45 shears off an end portion of tubular material 16 and locates it in a second position directly in line with channel 46B. The air cylinder 32 is then energized, by receiving air from tube 32A, and push rod 36 is moved in a downwardly direction through channel 46B. When a printed circuit board hole is positioned over base finger projection 49, the sheared tubular material 16 is pushed into the printed circuit board hole and into contact with base finger projection 49 by push rod 36.

When copper tubing is used as tubular material 16, machine 10 is used to cut, insert, and subsequently form an eyelet in a printed circuit board. A bottom eyelet shoulder is formed by base projection 49 flaring (buckling) out the bottom section of the cut length of the tubular material and a top shoulder is formed by push rod 36 flaring (buckling) out the top section of the cut length of the tubular material. The reduced end portions 36A and 49A will fit inside the sheared off end portion of material 16 and insure that the material buckles outwardly to form the shoulders of the eyelet.

Apparatus 52, after sequentially supplying air to tubes 20A, 42A and 32A, then sequentially supplies air to air tubes 32B, 42B, and 20B respectively and resets machine 10 in its original position. Thus, in sequence, push rod 36 is withdrawn from cavity 45A, cutting block 45 is restored to its original first position, and feeding apparatus 26 is restored to its initial position. As air is applied to cylinder 20 through tube 20B, piston 27 moves in an upwardly direction which first rotates cam cylinder 29, causing plate 30 to release tubular material 16, and then moves assembly 26 upward. Thus on the upstroke of feeding assembly 26, tubular material 16 is not held.

By removing assembly 47 from machine 10 and using flexible teflon tubing as tubular material 16, machine 10 performs the function of a solder guard insertion machine, solder guards being used to protect printed circuit board holes from solder and/or to solder protect contact terminals of components which may or may not be mounted on printed circuit boards. When the machine is used for this purpose, a printed circuit board template may be used along with the locating nipple 47A on base plate 11 for proper positioning of the printed circuit board with respect to assembly 46. The use of a beam of light to aid in circuit board positioning is also contemplated.

Figure 3:
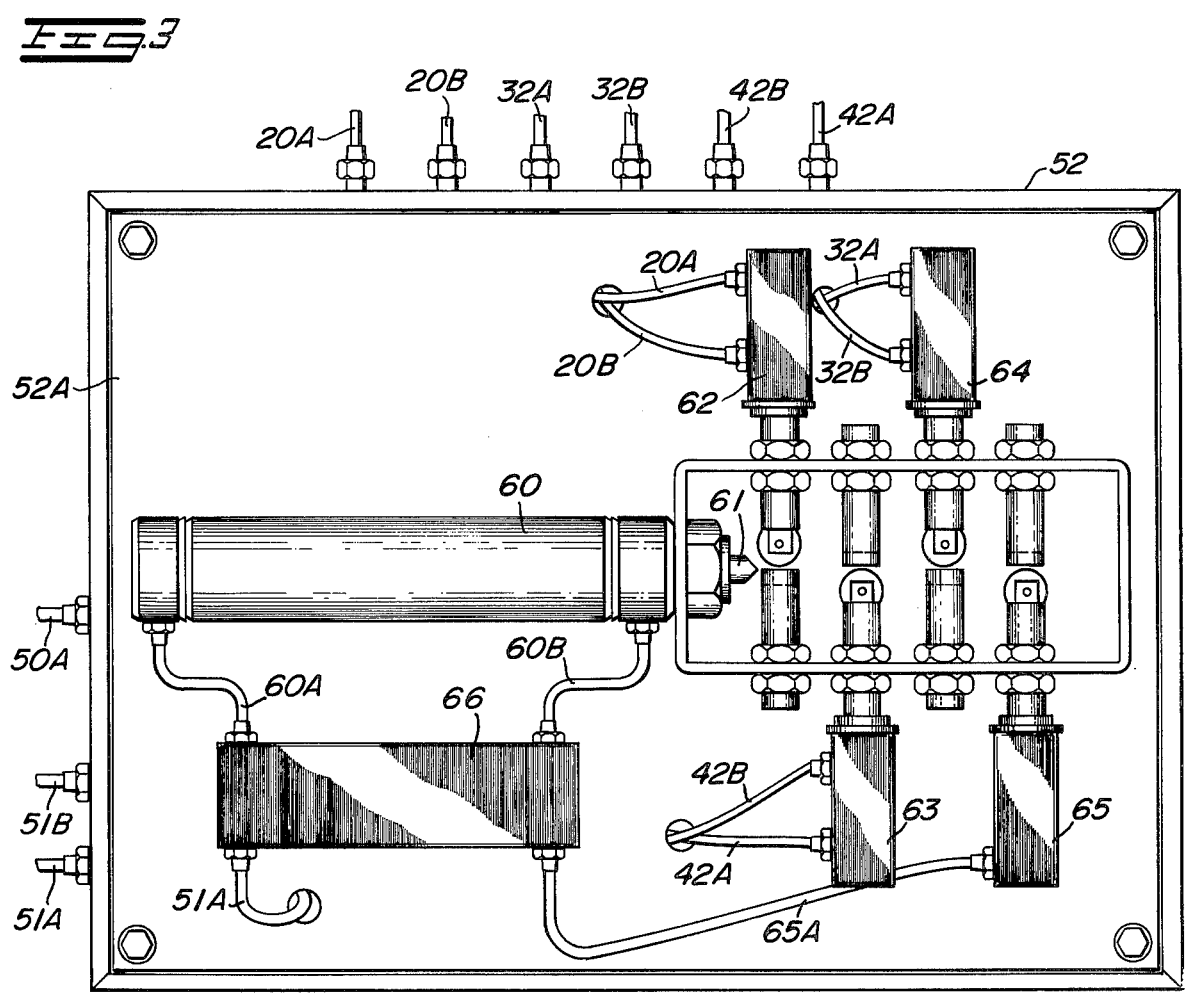
FIG. 3 is a perspective view of the sequencing apparatus of the inventive machine shown in FIG. 1.

FIG. 3 shows the internal configuration of sequencing apparatus 52. A master air cylinder 60 having a piston arm 61 is mounted horizontally on a support structure 52A. Air tubes 60A and 60B are shown connected to opposite ends of cylinder 60. A series of four pneumatic switches 62, 63, 64 and 65 are alternately mounted on opposite sides and positioned so that they will be sequentially activated by the horizontal motion of piston arm 61. A pneumatic relay 66 is shown receiving tubes 51A, 60A, and 60B. Switches 62 through 65 are standard pneumatic switches such as switch LM5-0908 made by Kiser Control Co and relay 66 is a standard relay such as Kiser Control relay RA70103. Tubes 20A and 20B are connected to switch 62, tubes 42A and 42B are connected to switch 63, tubes 32A and 32B are connected to switch 64, and a tube 65A is connected between switch 65 and relay 66. Pneumatic devices 62 to 66 are also each connected to air supply tube 50A (these connections are not shown in FIG. 3).

When foot switch 51 is depressed, relay 66 is activated and supplies air to master cylinder 60 through tube 60A. Piston 61 is then moved in a horizontal direction which sequentially activates switches 62, 63, 64, and 65 respectively. When switch 62 is activated, air is supplied to tubing 20A; when switch 63 is activated, air is supplied to tubing 42A; and when switch 64 is activated, air is supplied to tubing 32A. Thus sequencing apparatus 52 controls the proper sequential movement of feeding means 26, cutting and positioning block 45, and inserting push rod 36. When the switch 65 is actuated, air supplied by tube 65A deactivates relay 66, which also causes horizontal piston 61 to reverse direction and return to its original position by applying air to cylinder 60 through tube 60B. As piston 61 returns, switches 64, 63, and 62 are de-energized and cause air to be supplied to tubes 32B, 42B and 20B, respectively. Thus apparatus 52 also resets the feeding, cutting, and inserting apparatus of machine 10.

When the machine 10 is to be used as an eyeleting machine, copper is the preferred material for tubular material 16. When machine 10 is to be used as a solder guard insertion machine, teflon tubing is the preferred material. The teflon material must be flexible so that it can be compressed when inserted into a hole while still maintaining enough elasticity to hold the teflon material after insertion, similar considerations apply when the teflon tubing is to be inserted onto a contact member of an electrical component.

While pneumatic switches are shown in this particular embodiment, other switches may be used to obtain proper sequencing without departing from the scope of this invention. The scope of the invention is also not limited to using the inventive machine in conjunction with a printed circuit board or printed circuit board electrical components.

While I have shown and described specific embodiments of this invention, further modifications and improvements will occur to those skilled in the art. All such modifications which retain the basic underlying principles disclosed and claimed herein are within the scope of this invention.

I claim:
1. A machine for inserting tubing onto a contact member comprising:
   a base;
   support means associated with said base for holding a supply of continuous tubular material having a predetermined internal dimension and an end portion;
   means coupled to said base for feeding said end portion a predetermined amount;
   means coupled to said base fo cutting a predetermined length of said tubular material from said end portion and locating said cut tubing length in a predetermined position;
   means coupled to said base, including a push rod having a reduced end portion smaller than said predetermined internal dimension and adapted for fitting therein, for inserting said cut tubing length from said predetermined position onto said contact member;
   means coupled to said base for sequentially activating said feeding, cutting, and insertion means according to a predetermined timing relationship; and
   means coupled to said sequencing means for actuating said sequencing means.

2. A machine according to claim 1 wherein said actuating means is a foot switch.

3. A machine according to claim 1 which includes location means coupled to said base for positioning a printed circuit board in a desired location with respect to said inserting means.

4. A machine according to claim 1 wherein said support means includes a spool for holding a continuous roll of said tubular material.

5. A machine according to claim 1 wherein each of said feeding, cutting, and inserting means includes a pneumatic air cylinder.

6. A machine according to claim 5 wherein said sequencing means includes a pneumatical cylinder.

7. A machine for eyeleting a printed circuit board comprising:
   a base having a finger projection with a reduced end portion;
   support means associated with said base for holding a supply of continuous tubular metallic solderable material having a predetermined internal dimension and an end portion;

means coupled to said base for feeding said end portion a predetermined amount when activated;

means coupled to said base for cutting a predetermined length of said tubular material from said end portion and locating said cut tubing length in a predetermined position when activated;

means, coupled to said base, including a push rod having a reduced end portion, for inserting said cut tubing length from said predetermined position into a printed circuit board hole and into contact with said base finger projection when activated, said reduced end portions of said push rod and said base projection each having a smaller dimension than said tubular internal dimension for fitting within said cut tubing length, whereby said push rod and said base projection each form a shoulder on the ends of said metallic cut tubing length;

sequencing means coupled to said base for sequentially activating said feeding, cutting, and insertion means in a predetermined timimg relationship and subsequently returning said feeding, cutting, and inserting means to their previous conditions; and means coupled to said sequencing means for actuating said sequencing means.

8. A machine according to claim 7 wherein said actuating means is a foot switch.

9. A machine according to claim 7 which includes location means coupled to said base for positioning a printed circuit board in a desired location with respect to said inserting means.

10. A machine according to claim 8 wherein said support means includes a spool for holding a continuous roll of said tubular material.

* * * * *